Sept. 28, 1965 C. P. DE VITO 3,209,312

ELECTRICAL TERMINAL

Filed April 20, 1962 2 Sheets-Sheet 1

INVENTOR.
CHARLES P. DE VITO

BY

Hill, Sherman, Meroni, Gross & Simpson ATTORNEYS

INVENTOR.
CHARLES P. DE VITO
BY
Hill, Sherman, Meroni, Gross & Simpson ATTORNEYS 3,209,312
ELECTRICAL TERMINAL Charles P. De Vito, Park Ridge, Ill., assignor, by mesne assignments, to Alcon Metal Products, Inc., a corporation of Delaware Filed Apr. 20, 1962, Ser. No. 189,122
11 Claims. (Cl. 339—275)

The present invention relates to improvements in electrical terminals of the solder lug type and more particularly concerns improvements in that variety of such terminals including gripping fingers for retaining electrical leads to be soldered to the terminals. This sort of connector or lug may also be referred to as a solder well terminal.

Prior electrical connectors of the solder well type comprising wire-gripping fingers have had serious disadvantages among which may be mentioned difficulties in fabricating and thus undue manufacturing cost, difficulties in effecting adjustments to accommodate variable gauges of wire, unduly critical tolerance requirements, lack of positive control upon the length of wire terminal received in the connector, etc.

It is accordingly an important object of the present invention to overcome the foregoing and other defects and disadvantages of prior devices of this character and to provide a new and improved electrical connector which can be produced efficiently at low cost to function reliably and efficiently.

Another object of the invention is to provide a new and improved electrical connector of the solder well variety having not only an efficient arrangement of wire retaining prongs or fingers, but also a novel integral stop can structure.

A further object of the invention is to provide a new and improved terminal affording a wire-gripping finger arrangement and an improved wire end stop cap or hood and finger retainer.

Still another object of the invention is to provide a new and improved solder well terminal structure especially suitable for tube socket arrangements.

A yet further object of the invention is to provide a new and improved connector for use in a tube socket assembly.

Other objects, features and advantages of the present invention will be readily apparent from the following detailed description of certain preferred embodiments thereof taken in conjunction with the accompanying drawings, in which.

Referring first to FIGURES 1–6, an electrical connector 15, of the kind referred to as a solder well connector, is disclosed which is especially adapted to be mounted on a strip of self-sustaining, rigid or semi-rigid insulating strip material 17 or on an insulating panel of similar material to receive electrical wires to be connected in desired electrical circuits. It will be understood, of course, that although the connector 15 may be made in any desirable size, that it is shown for illustrative purposes greatly enlarged from the usual commercial sizes for this type of connector.

Figures 1, 2, 3, 4, 5, 6:
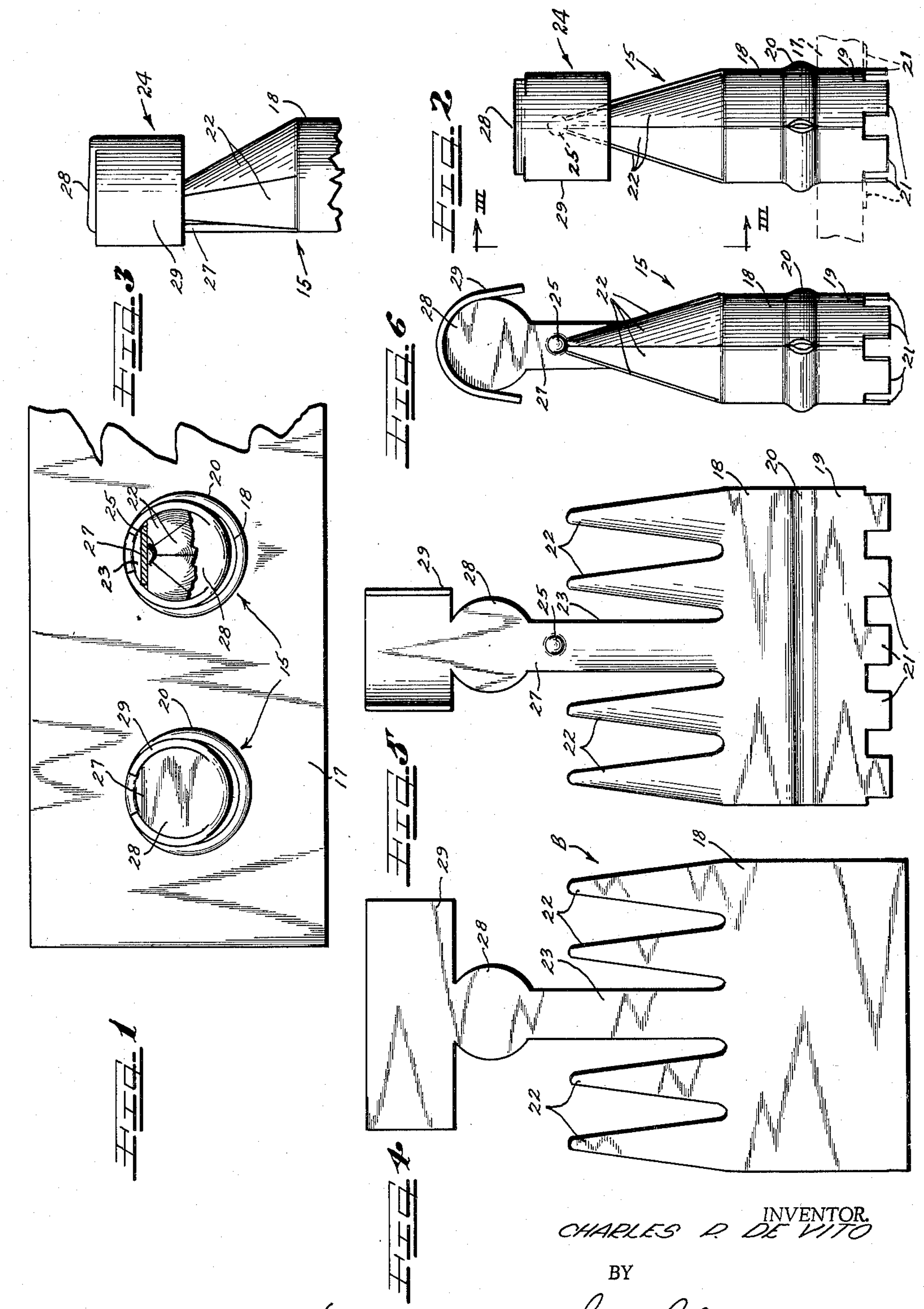
FIGURE 1 is a fragmentary plan view of a connector strip showing a plurality of connectors thereon embodying features of the invention.
FIGURE 2 is a front elevational view of one of the connectors.
FIGURE 3 is a fragmentary side elevational view of the connector, taken substantially in the plane of line III—III of FIGURE 2.
FIGURE 4 is a plan view of a sheet metal blank from which one of the connectors is adapted to be made.
FIGURE 5 is a plan view of the blank after being further worked.
FIGURE 6 is a front elevational view of the connector after it has been partially completed.

Each of the connectors 15 includes a hollow, tubular body 18 having an open base end portion 19 engageable through a suitable aperture in the mounting strip or panel 17. At the upper end of the base portion 19 where it joins the body 18, an annular reinforcing and seating rib shoulder bulge 20 is provided to engage one side of the mounting panel 17 about the connector-receiving opening therein, while the free end of the base portion 19 is provided with suitable means such as a plurality of bendable riveting or retaining lugs 21 which, as shown in dash outline in FIGURE 2, are bent or riveted over to clamp the mounting panel 17 between the shoulder 20 and the bent over lugs 21.

At its opposite end the tubular body 18 has a plurality of integral tapered, converging wire gripping fingers 22, preferably four in number, cooperating with and preferably converging toward a back upstanding integral stem portion 23 supporting an overhanging cap or hood 24. Each of the fingers 22 and the opposing portion of the stem 23 is transversely arched for resilient stiffness.

In the exemplary form of the invention illustrated, the stem portion 23 is sufficiently longer than the fingers 22 to accommodate a reinforcing dimple node 25 adjacent to but projecting inwardly slightly beyond or above the tips of the fingers on a neck portion 27 of the stem and to which the hood 24 is integrally attached. By preference the neck portion 27 is only of sufficient length to enable convenient bending of a hood crown disk portion 28 into overlying coaxial relation to the body 18. Integrally attached to the front edge portion of the crown disk 28 is a depending skirt flange 29 which encircles the tip end portions of the fingers 22 and is of about the same outside diameter as the outside diameter of the body 18. It will be observed that the skirt flange 29 is attached on its upper margin to the front portion of the margin of the crown disk 28 and extends about the side perimeter portions of the crown disk, with end portions of the flange overlapping the adjacent respective sides of the neck 27. Thereby the skirt flange 29 is effectively resistant to spreading open and coacts in a desirable manner with the neck 27 to retain the hood 24 against being bent up, that is away from the fingers 22. Further, by surrounding the tip end portions of the fingers 22, the skirt flange 29 limits the extent to which the fingers 22 can spread open or apart in response to insertion of large size or gauge wires or bundles of wires, within the capacity of the tubular body 18 into gripping engagement with the fingers. This positively assures that the fingers will maintain thorough grip on the wire or wires.

Another function of the skirt flange 29 is to prevent a wire terminal end that is thrust into the hood cavity from escaping laterally from the stop provided by the crown disk 28.

In FIGURES 4, 5 and 6 certain illustrative steps or stages in the making of the terminal 15 from flat sheet metal strip, such as brass, of suitable gauge are depicted. It will be understood that in a progressive die set up there may be and usually will be several intermediate additional forming steps, as is well known in the metal stamping and forming art. However, it is believed that the three selected forming steps will adequately indicate how the connector is formed from an initial flat blank B as shown in FIGURE 4 to the completed connector 15 as shown in FIGURE 2.

In the initial blank B, all parts of the connector appear in one integral piece. Thus, the body portion 18 appears as a solid flat portion of appropriate width and length having two of the fingers 22 projecting from its upper margin, as viewed in FIGURE 4, equidistantly spaced by pairs on each side of the stem 23 which extends centrally from such upper margin. It will be observed that the base width of the fingers 22 and of the stem 23 is, in this instance, substantially the same. At the upper end of the stem 23 is provided the integral crown disk portion 28 and thereon the skirt flange portion 29 affording a substantially T-shape to the stem and hood portions of the blank.

Subsequently, as shown in FIG. 5, the blank is worked to press the shoulder rib 20 substantially medially thereacross and thus afford the base portion 19, the lower margin of which is notched out to provide the riveting lugs 21. Further, the fingers 22 are shaped into transversely arched form and the stem 23 is formed with the node dimple 25 and between that and the base end of the stem is transversely arched similarly as the fingers 22. Also, the skirt flange portion 29 is partially formed up to substantially U-shape.

By subsequent forming operations, the body 18 as well as the base end portion 19 and the shoulder rib 20 are shaped into tubular substantially cylindrical form and the side edges of the blank brought as nearly as practicable into contiguity. At this time, also, the fingers 22 are brought into convergence with one another and the stem 23. The skirt flange 29 is now bent into a position generally normal to the plane of the crown disk portion 28 but with the side terminal end portions of the flange flaring generally tangentially from the disk perimeter, substantially as shown in FIG. 6.

Finally, the hood disk portion 28 is bent at the neck 27 into overlying relation to the fingers 22 and the free terminal end portions of the skirt flange 29 are bent into overlapping generally clasping relation to the back of the neck portion 27, thus completing shaping of the terminal 15. The completed terminal may then be plated or otherwise treated, and is ready for use, that is, to be mounted on a supporting base plate, strip or disk member and to receive one or more wires to be soldered thereto.

In the modification of FIGURES 7–13, there is depicted an adaptation of the invention to a solder well terminal 30 of the tube socket type especially adapted for use in a tube socket assembly 31. For this purpose, the terminal structure 30 comprises a one-piece construction including a tubular body 32 carrying a plurality, desirably four, convergently related tapered retaining fingers 33 also converging toward a stem 34 extending from the body 32 in the same general direction and to an appropriately greater length than the fingers.

On a neck portion 35 of the stem 34, which projects beyond the tips of the fingers 33, is provided an inwardly pressed dimple node 37 located adjacent to the tips of the fingers and reinforcing the neck portion adjacent to an integral cap or hood 38 overlying the fingers 33 substantially coaxially with the tubular body 32. This hood comprises a crown portion 39 and a skirt flange portion 40.

In addition to the wire gripping portion including the prongs 33, the connector 30 has a tube pin gripping portion 41 comprising an extension from the stem portion 34 above and beyond the hood 38. To this end, the stem 34 has a short spacer extension flange portion 42 extending upwardly beyond the back margin of the hood crown 39. Extending from the spacer flange 42 in a direction rearwardly and normal to the axis of the stem 34 is a connecting flange portion 43 to which the pin gripping portion 41 is integrally attached.

Figure 9:
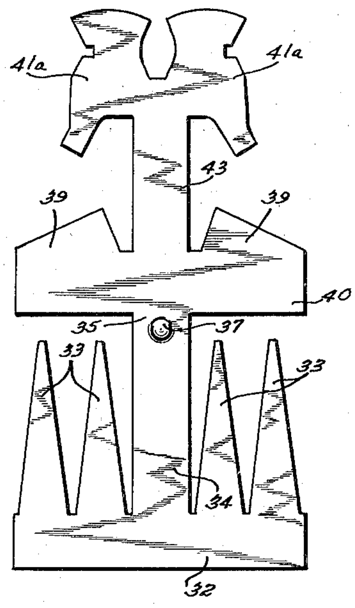
FIGURE 9 is a plan view of a sheet metal blank from which the connector shown in FIGURE 8 is adapted to be made.
Figure 10:
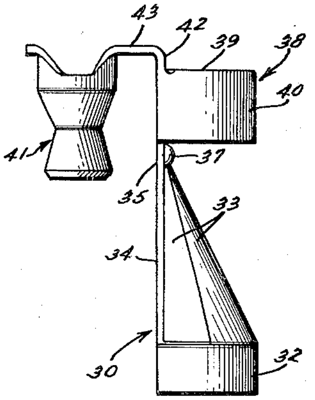
FIGURE 10 is a side elevational view of the connector, as made from the blank of FIGURE 9 and on the same scale as the blank.
Figure 11:
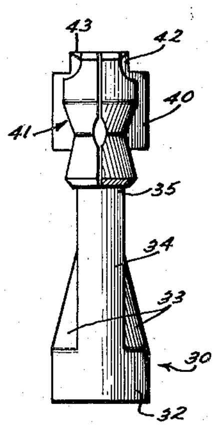
FIGURE 11 is a rear elevational view of the connector.
Figure 13:
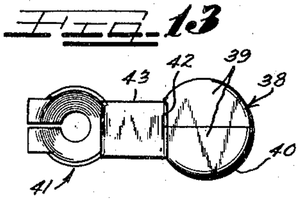
FIGURE 13 is a top plan view thereof.
Figure 12:
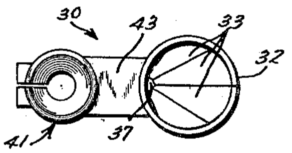
FIGURE 12 is a bottom plan view of the connector of FIGURE 10.

All parts or portions of the connector 30 are of such structure that the connector is adapted to be made readily by die stamping and pressing operations from a single piece of material such as suitable thin gauge brass strip initially blanked out in the flat as shown in FIG. 9. To this end, the blank has at its lower end portion, as viewed in FIG. 9 the body flange 32 of suitable length and width from the upper margin of which extend the fingers 33 in complementary pairs equidistantly respectively located at the opposite sides of the centrally extending stem 34. In this instance the stem 34 is slightly wider than the base end portions of the fingers 33, so that the stem contains more stock and is thus of an adequate strength to support the body 32 and the fingers 33 of the terminal.

In generally T-shaped form suitably spaced beyond the tips of the fingers 33, the blank has identical oppositely extending flange portions comprising parts from which the hood skirt flange 40 are subsequently formed. On the upper margin of each of the skirt flange portions 40 is a flange extension ultimately to provide the hood crown 39.

On the free terminus of the connecting flange portion 43 extension of the neck 34 is a pair of identical wing-like flanges 41*a* offset from one another and arranged for subsequent formation and coaction to provide the pin gripping socket portion 41.

Figure 8:
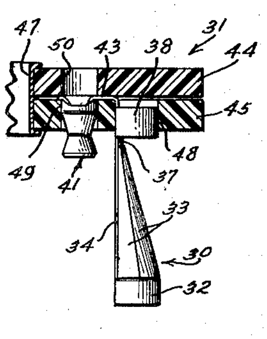
FIGURE 8 is an enlarged fragmentary sectional detail view taken substantially on the line VIII—VIII of FIGURE 7.

By progressive suitable forming steps, the blank of FIGURE 9 is ultimately shaped in its various portions to provide the finished terminal structure 30 which is then ready to be assembled with the tube socket assembly 31 comprising a pair of superimposed, sandwich-like, coextensive insulating plate 44 and 45 secured together as by a central grommet rivet 47. Suitable complementary adjacent apertures 48 and 49 are provided in the lower plate or panel 45 as seen in FIG. 8 to receive the hood 38 and the pin socket portion 41, respectively therein. In any event, the aperture 48 must be of large enough diameter to pass the connector body 32 therethrough in effecting assembly. Through this arrangement, the body 32 of the connector and the pin receiving socket 41 project downwardly from the lower side of the lower plate 45, with the connecting strip or flange 43 of the connector resting on that portion of the plate 45 between the two apertures and clamped thereagainst by the upper plate 44.

An aperture 50 is provided in the upper plate 44 coaxially aligned with the aperture 49 of a size to permit passage of a terminal pin of an electronic tube or other electrical device generically encompassed by the term "tube" as related to a tube socket assembly 31 of this kind. On passing through the aperture 50, the terminal pin of the tube engages within the pin gripping socket portion 41 of the terminal.

Figure 7:
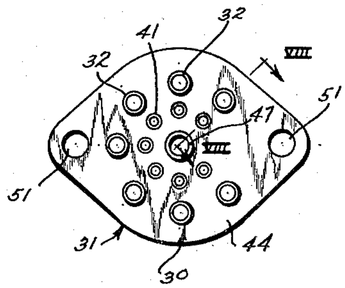
FIGURE 7 is a plan view of a tube socket assembly carrying a modification of the connector especially adapted for this purpose.

It will be understood, of course, that as many of the terminals 30 will be provided for on the tube socket 31 as may be required for any particular purpose, seven being shown in FIGURE 7, but a larger or smaller number may be used as required. As is customary, the tube socket plates 44 and 45 are provided with aligned rivet holes 51 for attachment of the tube socket assembly to a supporting member in an electrical or electronic apparatus.

In respect to both forms of the connector, namely the connector 15 and connector 30, after being mounted on a respective support for use, assembly of one or more wires therewith is easily effected by pushing the wire in through the open end of the body part of the connector and past the gripping tips of the retaining fingers of the connector. The distance to which the end of the electrical wire lead can project beyond the gripping tips of the fingers is limited by the stop provided by the crown flange of the hood of the connector in each instance. Lateral escape of the wire end is precluded by the skirt flange of the hood. After all of the necessary wire leads have been thus assembled with a set of companion connectors, pot or dip soldering may be resorted to for permanently fastening the wire leads to the connectors.

In both forms of the connector, the indented reinforcing node, either 25 or 37, by its adjacency to the tips of the retaining fingers has a coaction therewith in retaining a wire lead thrust endwise through the open end of the body of the connector into gripping engagement with the finger tips. As the end portion of the wire passes the node dimple the wire is shifted laterally away from the stem of the connector toward the engaging and retaining tips of the fingers, and this sideward thrust of the wire toward the tips enhances the retaining gripping engagement of the wire by the tips. The node dimple thus coacts with the retaining tips on that portion of the wire which is gripped when the wire comes to rest at termination of the in-thrust movement of the wire as when it has reached the limit of over-travel by engagement with the overlying hood. The wire is then effectively held against withdrawal displacement from the connector until soldering has been effected and thereafter is, as pointed out above, permanently retained in electrical connection with the connector.

It will be understood that modifications and variations may be effected without departing from the scope of the novel concepts of the present invention.

I claim as my invention:

1. An electrical connector of the solder well type having
- a tubular body open at one end to receive one or more lead wires therein,
- a plurality of elongated tapered retaining fingers on and projecting from the opposite end of said body,
- a stem on the body and projecting from said opposite end in the same direction as said fingers,
- said fingers having tips thereon converging in wire retaining relation toward said stem,
- said stem having a neck portion projecting beyond the tips of the fingers,
- said neck portion carrying a stop hood overlying said fingers, whereby a lead wire thrust endwise into said body through said one end and into gripping engagement between said stem and said finger tips and past said tips will be stopped to a limited over-travel by engagement with said hood.

2. An electrical connector of the solder well type having
- a tubular body open at one end to receive one or more lead wires therein,
- a plurality of elongated tapered retaining fingers on and projecting from the opposite end of said body,
- a stem on the body and projecting from said opposite end in the same direction as said fingers,
- said fingers having tips thereon converging in wire retaining relation toward said stem,
- said stem having a neck portion projecting beyond the tips of the fingers,
- said neck portion carrying a stop hood overlying said fingers,
- and a node dimpled in said stem adjacent to and in such opposing relation to said finger tips as to cooperate with said finger tips for retainingly engaging a wire, whereby a lead wire thrust endwise into said body through said one end and into gripping engagement between said node and said finger tips and past said tips and node will be stopped to a limited over-travel by engagement with said hood.

3. An electrical connector of the solder well type having
- a tubular body open at one end to receive one or more lead wires therein,
- a plurality of elongated resilient tapered retaining fingers on and projecting from the opposite end of said body,
- said fingers being convergently related for lead wire gripping coaction,
- a stem on and projecting from said opposite end of said body,
- and a wire stop hood carried by said stem and overlying said fingers and including
  - a crown portion
  - and a skirt flange which surrounds the tip end portions of the fingers and prevents their spreading apart beyond the inside diameter of the skirt flange, whereby a lead wire thrust endwise into said body through said one end and into gripping engagement with said finger tips and past said tips will be stopped to a limited over-travel by engagement with said hood.

4. In an electrical connector of the character described made from a single piece of sheet metal,
- a body portion bent into tubular form and having one open end,
- said body having a plurality of wire retaining tapered fingers projecting from its opposite end and
- a stem of about the same width as the base width of the fingers also projecting from said opposite end and to a greater length than the fingers,
  - said stem having a hood disk portion overlying the fingers
  - and a skirt flange attached to and surrounding and depending from the perimeter of the hood disk and having end portions retainingly overlapping the stem, whereby a lead wire thrust endwise into said body through said open end and into gripping engagement with said finger tips and past said tips will be stopped to a limited over-travel by engagement with said hood.

5. An electrical connector of the solder well type made from sheet metal and having
- a tubular body open at one end to receive one or more lead wires therein,
- a plurality of retaining fingers on and projecting from the opposite end of said body,
- a stem on and projecting from said opposite end of said body,
- said fingers having side edges substantially contiguous to one another and tips generally convergently related for lead wire gripping coaction, and a wire-stop hood on said stem in adjacent overlying relation to and defining a cavity opening toward said finger tips,
- said hood comprising a crown portion and a skirt formed from flange means originally extending transversely relative to the stem and bent to shape with the crown extending laterally relative to the stem into opposing relation to the finger tips and the skirt extending generally toward said opposite end of the body, whereby a lead wire thrust endwise into said body through said one end and into gripping engagement with said finger tips and past said tips will be stopped to a limited overtravel by engagement with said crown portion within said hood cavity and will be prevented from escaping laterally by said skirt.

6. An electrical connector as defined in claim 5, in which said skirt is attached to said crown portion and has flange end portions overlapping said stem and thereby resisting spreading open of the skirt and bending of the hood away from the fingers by thrust of lead wire against said crown portion.

7. An electrical connector as defined in claim 5, in which the flange means of the skirt comprise originally oppositely extending flange portions extending laterally on the stem and the crown portion comprises flange means carried by the skirt flange means.

8. An electrical connector as defined in claim 5, wherein said stem has an extension thereon beyond the hood and which extension carries a pin-gripping socket portion.

9. An electrical connector of the solder well type having a tubular body open at one end to receive one or more lead wires therein, a plurality of retaining fingers on and projecting from the opposite end of said body, a stem on and projecting from said opposite end of said body, said fingers having tips generally convergently related for lead wire gripping coaction, and a wire stop hood carried by said stem and overlying said fingers, said hood having a crown portion and a skirt flange having an edge which projects toward the tubular body and encompasses the fingers so that the flange affords with the crown portion a cavity into which said finger tips project to guide a wire end into the cavity, whereby a lead wire thrust endwise into said body through said one end and into gripping engagement with said finger tips and past said tips will be stopped to a limited overtravel by engagement with said hood within said cavity and the skirt flange prevents lateral escape of the wire end.

10. An electrical connector of the character described comprising a one-piece sheet metal construction including a body portion bent into tubular form and having a plurality of elongated convergent wire gripping fingers projecting from one end with their tips in wire gripping adjacency and a stem portion also projecting from said one end and longer than said fingers, said fingers and said stem being of substantially the same width and being closed onto one another whereby to close said one end of the body, and a hood supported on the stem and overlying the tips of said fingers and serving as a wire stop, whereby a lead wire thrust endwise into said body through its opposite end and into gripping engagement with the fingers and past the fingers will be stopped to a limited over-travel by engagement with said hood.

11. An electrical connector of the character described comprising a one-piece sheet metal construction including a body portion bent into tubular form and having a plurality of elongated convergent wire gripping fingers projecting from one end with their tips in wire gripping adjacency, and a stem portion also projecting from said one end and longer than said fingers, said fingers and said stem together substantially closing over said one end of the body, a portion supported entirely on the stem overlying the tips of said fingers and serving as a wire stop whereby a lead wire thrust endwise into said body through its opposite end and into gripping engagement with the fingers and past the fingers will be stopped to a limited over-travel by engagement with said stop portion, a short spacer extension flange portion projecting beyond said wire stop portion, a connecting flange portion projecting from said extension flange portion and away from said wire stop portion, and a tube pin gripping socket portion on the free end of said connecting flange portion and projecting in the opposite direction from said stem portion.

References Cited by the Examiner

UNITED STATES PATENTS

| | | | |
|---|---|---|---|
| 2,068,230 | 1/37 | Franklin | 339—194 |
| 2,486,115 | 10/49 | Chiuchiolo | 339—242 |
| 2,676,310 | 4/54 | Alden | 339—193 |
| 2,723,384 | 11/55 | Lang | 339—194 |
| 2,830,278 | 4/58 | Schwarz | 339—275 |
| 3,060,402 | 10/62 | Olsson et al. | 339—220 |

JOSEPH D. SEERS, *Primary Examiner.*